United States Patent [19]

Sato et al.

[11] Patent Number: 4,621,344

[45] Date of Patent: Nov. 4, 1986

[54] MAGNETIC BUBBLE DEVICE

[75] Inventors: Toshihiro Sato; Ryo Suzuki, both of Hachioji; Tadashi Ikeda, Kanagawa; Teruaki Takeuchi, Kokubunji; Yutaka Sugita, Tokorozawa, all of Japan

[73] Assignee: Hitachi, Ltd., Tokyo, Japan

[21] Appl. No.: 669,427

[22] Filed: Nov. 8, 1984

[30] Foreign Application Priority Data

Nov. 11, 1983 [JP] Japan .................. 58-210853

[51] Int. Cl.⁴ .............................. G11C 19/08
[52] U.S. Cl. ........................ 365/36; 365/26
[58] Field of Search .............. 365/15, 18, 26, 35, 365/36, 41, 42

[56] References Cited

U.S. PATENT DOCUMENTS 3,921,155 11/1975 Minnick et al. .............. 365/18
4,237,544 12/1980 Bonyhard .................... 365/15

FOREIGN PATENT DOCUMENTS 0130879 10/1981 Japan ....................... 365/35

Primary Examiner—James W. Moffitt
Attorney, Agent, or Firm—Antonelli, Terry & Wands

[57] ABSTRACT

A magnetic bubble device has minor loops formed through ion implantation and used for storing information. As the density becomes higher, inside turn corner portions are formed on the minor loops. Dummy patterns having circular, triangular or other shapes are disposed in the vicinity of the corner portion. It is desirable that the minimum distance X between the dummy pattern and the propagation track satisfy the relation of $1.5\,D \leq X \leq 3.5\,D$, where D represents the diameter of a bubble.

18 Claims, 10 Drawing Figures

MAGNETIC BUBBLE DEVICE

BACKGROUND OF THE INVENTION

The present invention relates to a magnetic bubble device and in particular to a magnetic bubble device in which a magnetic bubble propagation track formed through ion implantation has a wide operation margin of bias magnetic field at the corner portions thereof.

As the magnetic bubble propagation track of a magnetic bubble device, a propagation track made of a soft magnetic material such as permalloy is widely used at present. As a technique suitable to increased density, however, gapless ion-implanted propagation tracks as disclosed in U.S. Pat. No. 3,828,329 are being developed at various labroatories. The absence of the gaps facilitates fabrication of the propagation track and density increase of the magnetic bubble device. When a high density device is to be constructed by using the gapless propagation track, the propagation track is folded several times as illustrated in FIG. 1. The magnetic bubble device includes a generator 2 for generating magnetic bubbles, major lines 4 and 6 for propagating the magnetic bubbles, minor loops 8 for storing information, and a detector 10 for detecting magnetic bubbles passed from the major line 6. The minor loops 8 are formed between the major lines 4 and 6 by using the ion implantation technique. In such a device, corner portions 12 are formed at inside turns of the minor loop 8.

FIG. 2 is an enlarged view of the corner portion 12. FIG. 3 shows the operation margin of the bias magnetic field for bubbles located in the straight portions 14 and 16 of a propagation track as illustrated in FIG. 2 and shows the operation margin of the bias magnetic field for bubbles located in the corner portions 18 and 20 of the propagation track.

In FIG. 3, lines 22 and 24 show the margins of the bias magnetic fields capable of activating magnetic bubbles at the straight portions 14 and 16 illustrated in FIG. 2, respectively. Lines 26 and 28 show the margins of the bias magnetic fields capable of activating magnetic bubbles at the corner portions 18 and 20, respectively. It is seen from FIG. 3 that the operation margins of the magnetic fields at the corner portions 18 and 20 are significantly decreased and deteriorated as represented by regions 30 surrounded by broken lines. In FIG. 3, the inplane field has been chosen to be 50 Oe.

The present inventors have examined the reason why the characteristics at the corners 18 and 20 are deteriorated as illustrated in FIG. 3. As a result of observing the movement of bubbles at the corner portions 18 and 20, it has been observed as an erroneous operation that some bubbles jump to the adjacent loops through paths 32 as represented by broken lines in FIG. 2. At a phase whereat bubbles located on a propagation track jump to its adjacent propagation track, magnetic poles around those propagation tracks were examined by using the Bitter method. The resultant magnetic poles are illustrated in FIG. 4. A region 34 shaded in FIG. 4 represents a magnetic pole which attracts bubbles. It was found from FIG. 4 that the attraction magnetic pole 34 located at the corner portion is switched at an inplane field angle which is earlier than other regions by approximately 15° and the magnetic pole 34 tends to be coupled with another attraction magnetic pole located in the adjacent loop. When the bias magnetic field is weak, the diameter of the bubble is increased, the interaction between the bubble and the magnetic pole being strengthened. Thus, the bubble becomes liable to jump to the adjacent loop. This is thought to be the cause of characteristics deterioration found in regions 30 as represented by broken lines in FIG. 3.

SUMMARY OF THE INVENTION

An object of the present invention is to provide a magnetic bubble device in which the magnetic bubble propagation track formed through ion implantation has a wide operation margin at the corner portions thereof.

If the phase whereat the magnetic pole is switched at the corner portion can be made equal to the phase at the inside 36 of the minor loop, the characteristics at the corner portions 18 and 20 illustrated in FIG. 2 can be improved. To realize this condition, dummy patterns 38 and 40 are disposed in the vicinity of the corner portions. For the purpose of examining the behavior of the magnetic pole in the presence of the dummy patterns, two circular patterns 38 and 40 were disposed in the direction [$\bar{1}\bar{1}2$] at an interval of X. Phases $\theta_1$ and $\theta_2$ were then measured when the magnetic poles of the patterns 38 and 40 were switched. FIG. 6 shows the result of measurement. The abscissa represents the distance X normalized by the bubble distance D and the ordinate represents the switching phase difference $\Delta\theta = \theta_1 - \theta_2$. It was confirmed that the bubble may propagate through a gap 42 existing between two circular patterns 38 and 40 without causing any problem provided that the distance X is not less than 1.5 times as long as the diameter D of the bubble. On the other hand, it was found that coupling between the magnetic pole located at the corner portion and its adjacent loop can be prevented by delaying the phase, whereat the magnetic pole of the corner portion is switched, by 5° or more. Accordingly, the value of X/D must be 3.5 or less. If the dummy patterns are so disposed as to satisfy the relation $1.5 \leq X/D \leq 3.5$, therefore, it is possible to prevent the coupling of the magnetic pole at the corner portion and hence the malfunction of the bubble. A range H illustrated in FIG. 6 represents the optimum range. As dummy patterns, circular patterns are used in FIG. 6. Even if rectangular patterns such as square-shaped patterns or triangular patterns are disposed at an interval of X, however, a similar effect can be obtained.

The magnetic bubble device of the present invention is based upon the above described studies. In accordance with the present invention, in a portion of the magnetic bubble propagation track formed through ion implantation, whereat the propagation direction is changed, dummy patterns are disposed independently of the propagation track.

DESCRIPTION OF THE PREFERRED EMBODIMENT

Figure 1:
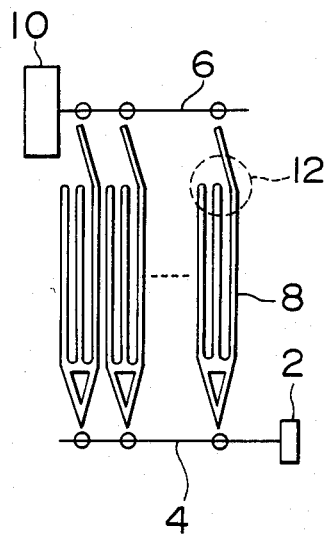
FIG. 1 shows the entire configuration of a magnetic bubble device which is formed by using the ion implantation technique and which includes minor loops having inside turn corner portions.
Figure 2:
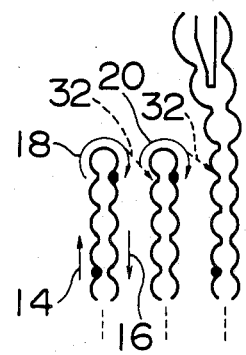
FIG. 2 shows an enlarged view of an inside turn corner portion of a minor loop.
Figure 7:
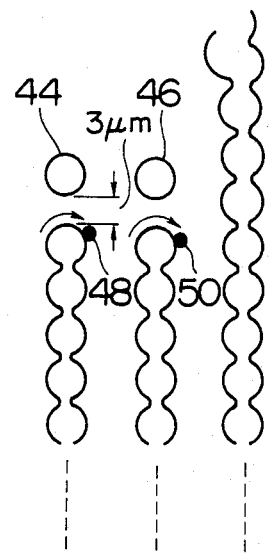
FIGS. 7 to 9 show embodiments of disposition of dummy patterns at the corner portion according to the present invention.

An embodiment of the present invention will now be described by referring to FIG. 7. Similarly to FIG. 2, FIG. 7 shows an inside turn corner portion of a minor loop of a magnetic bubble device. Dummy patterns 44 and 46 are disposed beyond ends of two inside turn corner portions and at slight distances from those ends. The propagation track formed through ion implantation comprises contiguous discs. The maximum diameter of a disc is then 4 $\mu$m. The diameter of dummy patterns 44 and 46 is 4 $\mu$m. The distance X between the dummy pattern and the propagation track is 3 $\mu$m. The diameter of bubbles 48 and 50 is 1 $\mu$m and the space between propagation tracks adjoining each other is 8 $\mu$m. When such configuration was adopted, the magnetic bubbles 48 and 50 were prevented from erroneously moving to the propagation track of the adjacent loop and were propagated on their original propagation track. As the propagation track, snake-type tracks may also be used instead of the contiguous disc type tracks.

Figure 8:
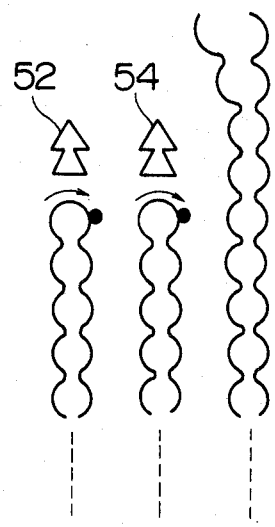

FIG. 8 shows another embodiment of the present invention. In FIG. 8, shapes of dummy patterns 52 and 54 are similar to triangles unlike FIG. 7. Similarly to the embodiment illustrated in FIG. 7, it was confirmed in this embodiment that bubbles were propagated without erroneously moving to a propagation track of the adjacent loop.

Figure 9:
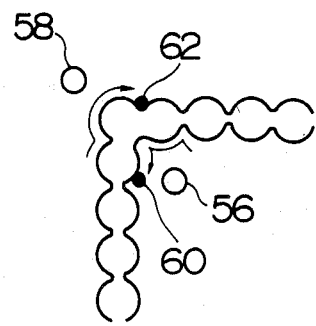

FIG. 9 shows propagation of magnetic bubbles 60 and 62 when circular dummy patterns 56 and 58 are disposed respectively inside and outside of a corner portion of a propagation track which bends at a right angle. Similarly to two preceding embodiments, malfunction of the magnetic bubbles 60 and 62 was not found either of inside and outside of the corner portion. Even if the propagation track is bent at an angle other than the right angle, a similar effect can be obtained.

Figure 3:
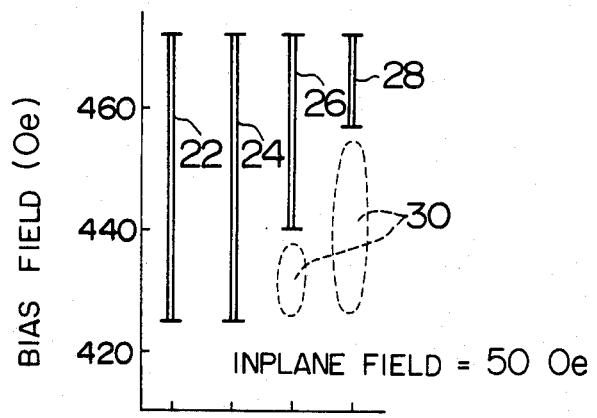
FIG. 3 is a graph for indicating the difference in the margin of the bias magnetic field representing the propagation characteristics of the magnetic bubble between the straight portions and the inside turn corner portions.
Figure 4:
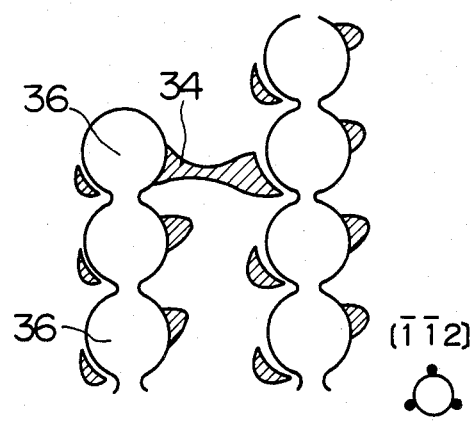
FIG. 4 is a plane view of magnetic poles located in the vicinity of the corner portion when observed by using the Bitter method.
Figure 5:
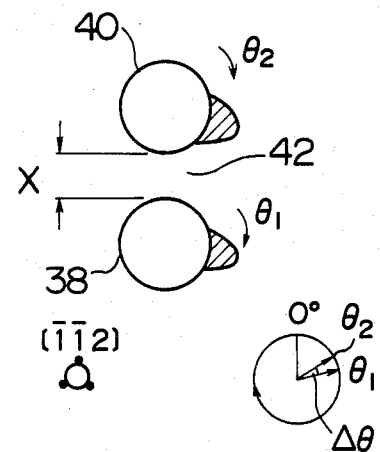
FIG. 5 is a plane view for illustrating the positions of the magnetic poles when two circular dummy patterns are disposed in the vicinity of the inside turn corner portion.
Figure 6:
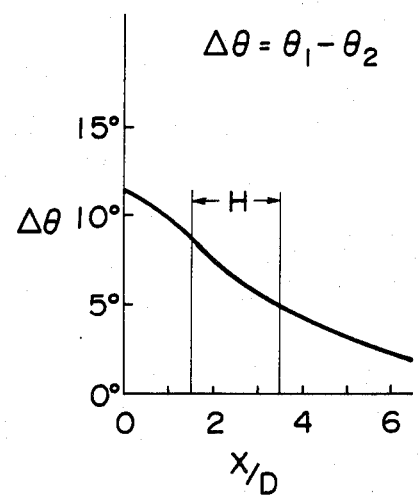
FIG. 6 shows the measured switching phase deviation ($\Delta\theta$) as a function of the interpattern distance normalized by the bubble diameter (X/D)
Figure 10:
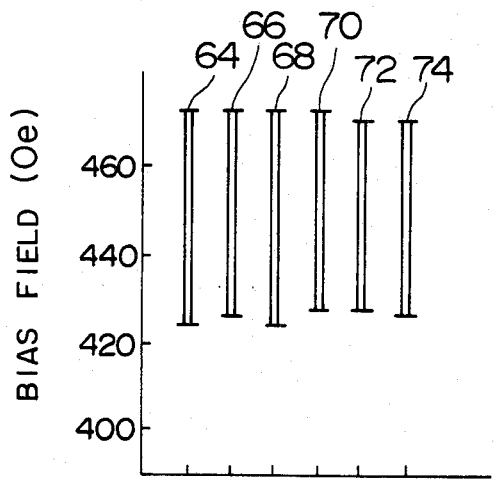
FIG. 10 shows the margins of the bias magnetic field when the dummy patterns according to the present invention are disposed at the corner portion.

Lines 64, 66, 68, 70, 72 and 74 of FIG. 10 respectively represent the bias magnetic field (Oe) when the dummy patterns 44, 46, 52, 54, 56 and 58 are disposed in the vicinity of respective corner portions of the above described three embodiments. The diameter of the magnetic bubble and the inplane field were chosen to be 1 $\mu$m and 50 Oe, respectively. As evident from FIG. 10, the margin of the bias magnetic field in the presence of dummy patterns has been increased as compared with FIG. 3 in which dummy patterns are not provided.

In a magnetic bubble device having magnetic bubble propagation tracks formed through ion implantation, corner portions suitable to higher density can thus be formed owing to the present invention.

What is claimed is:

1. A magnetic bubble device comprising:
   a propagation track formed through ion-implantation, said propagation track being defined by an ion-implanted area; and
   a dummy pattern disposed independently of said propagation track and enclosed by said ion-implanted area, said dummy pattern being disposed in the vicinity of a corner of said propagation track where the propagation direction of magnetic bubbles is changed, said dummy pattern enabling a phase at which a magnetic pole is switched at said corner portion of said propagation track to be made substantially equal to a phase at which a magnetic pole is switched at a portion of said propagation track other than said corner portion.

2. A magnetic bubble device according to claim 1, wherein the minimum distance X between the position where said dummy pattern is disposed and said propagation track satisfies a relation of 1.5 D$\leq$X$\leq$3.5 D, where D represents the diameter of a bubble.

3. A magnetic bubble device according to claim 1, wherein said dummy pattern has a circular configuration.

4. A magnetic bubble device according to claim 1, wherein said dummy pattern has a triangular configuration.

5. A magnetic bubble device according to claim 1, wherein said dummy pattern is disposed in the vicinity of the outside corner of said corner portion where the propagation direction of magnetic bubbles is changed.

6. A magnetic bubble device according to claim 1, wherein said dummy pattern is disposed in the vicinity of the inside corner of said corner portion where the propagation direction of magnetic bubbles is changed.

7. A magnetic bubble device comprising:
   a propagation track formed through ion-implantation; and
   means forming a dummy pattern independently of said propagation track, said dummy pattern means being disposed in the vicinity of a corner portion of said propagation track where the propagation direction of magnetic bubbles is changed, said dummy pattern means enabling a phase at which a magnetic pole is switched at said corner portion to be substantially equal to a phase at which a magnetic pole is switched at a portion of said propagation track other than said corner portion so as to prevent erroneous jumping of a magnetic bubble from said corner portion to an adjacent propagation track.

8. A magnetic bubble device according to claim 7, wherein the minimum distance X between the position where said dummy pattern means is disposed and said propagation track satisfies a relation of 1.5 D$\leq$X$\leq$3.5 D, where D represents the diameter of a bubble.

9. A magnetic bubble device according to claim 7, wherein said dummy pattern means has a circular configuration.

10. A magnetic bubble device according to claim 7, wherein said dummy pattern means has a triangular configuration.

11. A magnetic bubble device according to claim 7, wherein said dummy pattern means is disposed in the vicinity of the outside corner of said corner portion where the propagation direction of magnetic bubbles is changed, 12. A magnetic bubble device according to claim 7, wherein said dummy pattern means is disposed in the vicinity of the inside corner of said corner portion where propagation direction of magnetic bubbles is changed.

13. A magnetic device according to claim 7, wherein said dummy pattern means serves for preventing erroneous jumping of magnetic bubbles without propagating a magnetic bubble therealong.

14. A magnetic bubble device comprising a propagation track formed through ion implantation, wherein a dummy pattern is disposed independently of said propagation track and at a portion of said propagation track where the propagation direction of magnetic bubbles is changed, the minimum distance X between said dummy pattern and said propagation track satisfying a relation of $1.5\,D \leqq X \leqq 3.5\,D$ where D represents the diameter of a bubble.

15. A magnetic bubble device according to claim 14, wherein said dummy pattern has a circular configuration.

16. A magnetic bubble device according to claim 14, wherein said dummy pattern has a triangular configuration.

17. A magnetic bubble device according to claim 14, wherein said dummy pattern is disposed in the vicinity of the outside corner of said portion of said progation track where the propagation direction of magnetic bubbles is changed.

18. A magnetic bubble device according to claim 14, wherein said dummy pattern is disposed in the vicinity of the inside corner of said portion of said propagation track where the propgation direction of magnetic bubble is changed.

* * * * *